(12) United States Patent
Ota

(10) Patent No.: US 6,191,621 B1
(45) Date of Patent: Feb. 20, 2001

(54) PEAK DETECTOR

(75) Inventor: Yusuke Ota, Mountain Lakes, NJ (US)

(73) Assignee: Lucent Technologies Inc., Murray Hill, NJ (US)

( * ) Notice: Under 35 U.S.C. 154(b), the term of this patent shall be extended for 0 days.

(21) Appl. No.: 09/334,001

(22) Filed: Jun. 15, 1999

(51) Int. Cl.[7] .................................................. G01R 19/00
(52) U.S. Cl. ............................................................. 327/58
(58) Field of Search .................................. 327/58, 59, 60, 327/61, 62

(56) References Cited

U.S. PATENT DOCUMENTS 5,038,055 * 8/1991 Kinoshita ............................ 307/351
5,469,090 * 11/1995 Narahara ............................... 327/58
5,986,481 * 11/1999 Kaminishi ............................. 327/96

* cited by examiner

*Primary Examiner*—Jeffrey Zweizig
(74) *Attorney, Agent, or Firm*—Eugene J. Rosenthal

(57) ABSTRACT

A bipolar peak detector that maintains the charge on its capacitor longer than prior art peak detectors can due to the discharging thereof that occurs during long periods of reception of only a single value in the received signal, e.g. a long string of zeros, by substantially exactly duplicating, i.e., duplicating to within manufacturing tolerances, the current that is leaking out of the capacitor and injecting the duplicate current into the capacitor.

19 Claims, 3 Drawing Sheets

PEAK DETECTOR

TECHNICAL FIELD

This invention relates to the art of peak detecting, i.e., finding the peak level of an analog signal, and more particularly, to a peak detector particularly suitable for burst mode communication.

BACKGROUND OF THE INVENTION

A problem in the art of peak detectors is that they use capacitors to store the peak amplitude of the signal whose peak is being detected. It is desirable to store the peak value as long as needed in the capacitor, e.g., for use in thresholding applications, especially where there may be long periods of reception of only a single value in the received signal, e.g. a long string of zeros. The value stored on the capacitor is buffered when providing its output for further processing. Although such buffering is necessary, disadvantageously, when the peak detector circuit is manufactured using bipolar devices, such buffering causes the capacitor to discharge, thereby reducing the period of time that the capacitor accurately stores the peak value.

SUMMARY OF THE INVENTION

I have recognized that the problem of the discharging of the peak detector capacitor for bipolar peak detectors can be overcome by substantially exactly duplicating, i.e., duplicating to within manufacturing tolerances, the current that is leaking out of the capacitor and injecting the duplicate current into the capacitor. Advantageously, the charge in the capacitor remains constant, and it can accurately store the peak value for a much longer time than could capacitors of prior art peak detectors.

DETAILED DESCRIPTION

Figure 1:
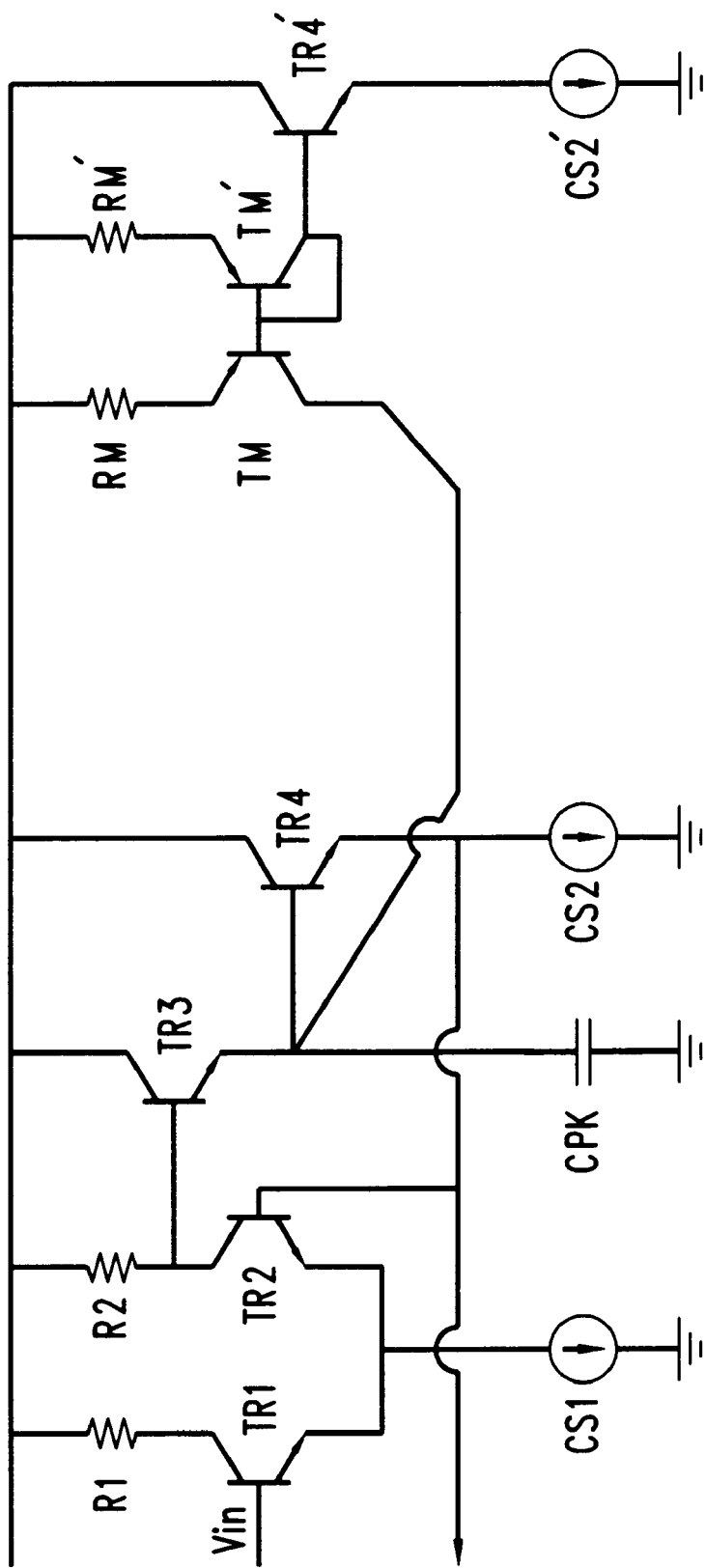
FIG. 1 shows an exemplary peak detector in accordance with the principles of the invention.

The following merely illustrates the principles of the invention. It will thus be appreciated that those skilled in the art will be able to devise various arrangements which, although not explicitly described or shown herein, embody the principles of the invention and are included within its spirit and scope. Furthermore, all examples and conditional language recited herein are principally intended expressly to be only for pedagogical purposes to aid the reader in understanding the principles of the invention and the concepts contributed by the inventor(s) to furthering the art, and are to be construed as being without limitation to such specifically recited examples and conditions. Moreover, all statements herein reciting principles, aspects, and embodiments of the invention, as well as specific examples thereof, are intended to encompass both structural and functional equivalents thereof. Additionally, it is intended that such equivalents include both currently known equivalents as well as equivalents developed in the future, i.e., any elements developed that perform the same function, regardless of structure.

Thus, for example, it will be appreciated by those skilled in the art that the block diagrams herein represent conceptual views of illustrative circuitry embodying the principles of the invention. Similarly, it will be appreciated that any flow charts, flow diagrams, state transition diagrams, pseudocode, and the like represent various processes which may be substantially represented in computer readable medium and so executed by a computer or processor, whether or not such computer or processor is explicitly shown.

The functions of the various elements shown in the FIGS., including functional blocks labeled as "processors" may be provided through the use of dedicated hardware as well as hardware capable of executing software in association with appropriate software. When provided by a processor, the functions may be provided by a single dedicated processor, by a single shared processor, or by a plurality of individual processors, some of which may be shared. Moreover, explicit use of the term "processor" or "controller" should not be construed to refer exclusively to hardware capable of executing software, and may implicitly include, without limitation, digital signal processor (DSP) hardware, read-only memory (ROM) for storing software, random access memory (RAM), and non-volatile storage. Other hardware, conventional and/or custom, may also be included. Similarly, any switches shown in the FIGS. are conceptual only. Their function may be carried out through the operation of program logic, through dedicated logic, through the interaction of program control and dedicated logic, or even manually, the particular technique being selectable by the implementor as more specifically understood from the context.

In the claims hereof any element expressed as a means for performing a specified function is intended to encompass any way of performing that function including, for example, a) a combination of circuit elements which performs that function or b) software in any form, including, therefore, firmware, microcode or the like, combined with appropriate circuitry for executing that software to perform the function. The invention as defined by such claims resides in the fact that the functionalities provided by the various recited means are combined and brought together in the manner which the claims call for. Applicant thus regards any means which can provide those functionalities as equivalent as those shown herein.

FIG. 1 shows an exemplary peak detector in accordance with the principles of the invention. TR1, TR2, R1, R2, and current source CS1 form a differential amplifier for amplifying input signal Vin, e.g., a signal received from a preamplifier of an optical receiver. The output of the differential amplifier is taken at the junction of R2 and TR2, and is supplied as input to a buffering circuit. More specifically, this output is supplied to the base of TR3 and controls the current that is supplied by TR3 to peak detector capacitor Cpk. In other words, TR3 performs two functions, both a) a buffering function for the output of the differential amplifier and b) the function of feeding current to peak detector capacitor Cpk. TR4 forms a buffer in conjunction with current source CS2 for the output of peak detector capacitor Cpk. Such buffering is necessary because any attempt to directly read out the signal on peak detector capacitor Cpk would result in severe disturbance of that signal. The output of the peak detector is taken at the junction of the emitter of TR4 and current source CS2. The output may be used as an input to a threshold decision circuit. This output is also fed back to the base of TR2 to stop the charging of peak detector capacitor Cpk. This avoids the overcharging of peak detector capacitor Cpk. The portion of the peak detector of FIG. 1 described heretofore is conventional.

In the arrangement shown in FIG. 1 there is a leakage current from peak detector capacitor Cpk to the base of TR4, through TR4 and ultimately to ground. When there is a long period of reception of only a single value in the received signal, e.g. a long string of zeros, the leakage may significantly erode the value of stored in peak detector capacitor Cpk, as peak detector capacitor Cpk is not being further charged. Such erosion results in the output value, which may be used as a threshold value in a system, such as a burst mode optical receiver, being too low, resulting in degradation of the performance of the system employing the peak detector.

To compensate for such leakage when there is a long period of reception of only a single value in the received signal, e.g. a long string of zeros, substantially exactly, i.e., to within manufacturing tolerances, the current that is leaking out of peak detector capacitor Cpk is injected into peak detector capacitor Cpk to compensate for the leakage. Advantageously, the charge in peak detector capacitor Cpk remains constant, and it can accurately store the peak value for a much longer time than could capacitors of prior art peak detectors.

To this end, in one embodiment of the invention, a current mirror is used to mirror a current that is specifically generated to be the same as the leakage current and to inject the mirrored current into peak detector capacitor Cpk. More specifically, transistor TR4' is coupled to current source CS2' in the same manner as transistor TR4 is coupled to current source CS2. Transistor TR4' is substantially identical to TR4, i.e., to within manufacturing tolerances transistors TR4' and TR4 are identical. Also, current source CS2' is substantially identical to current source CS2, i.e., to within manufacturing tolerances CS2' and CS2 are identical. As a result, there is a leakage current into the base of TR4' that is substantially identical to the leakage current from peak detector capacitor Cpk into the base of TR4.

TM, TM', RM, and RM' are arranged as a current mirror. TM is substantially identical to TM' and RM is substantially identical to RM'. Note that while the other transistors shown herein are of the NPN type, transistors TM and TM' are of the PNP type. As a result, the leakage current into the base of TR4' is mirrored at the collector of TM, which is the output of the current mirror. This mirrored leakage current, which is a duplicate of the leakage current, is supplied to the node at which peak detector capacitor Cpk, TR3 and TR4 are coupled, so that the duplicate leakage current is injected into peak detector capacitor Cpk.

Figure 2:
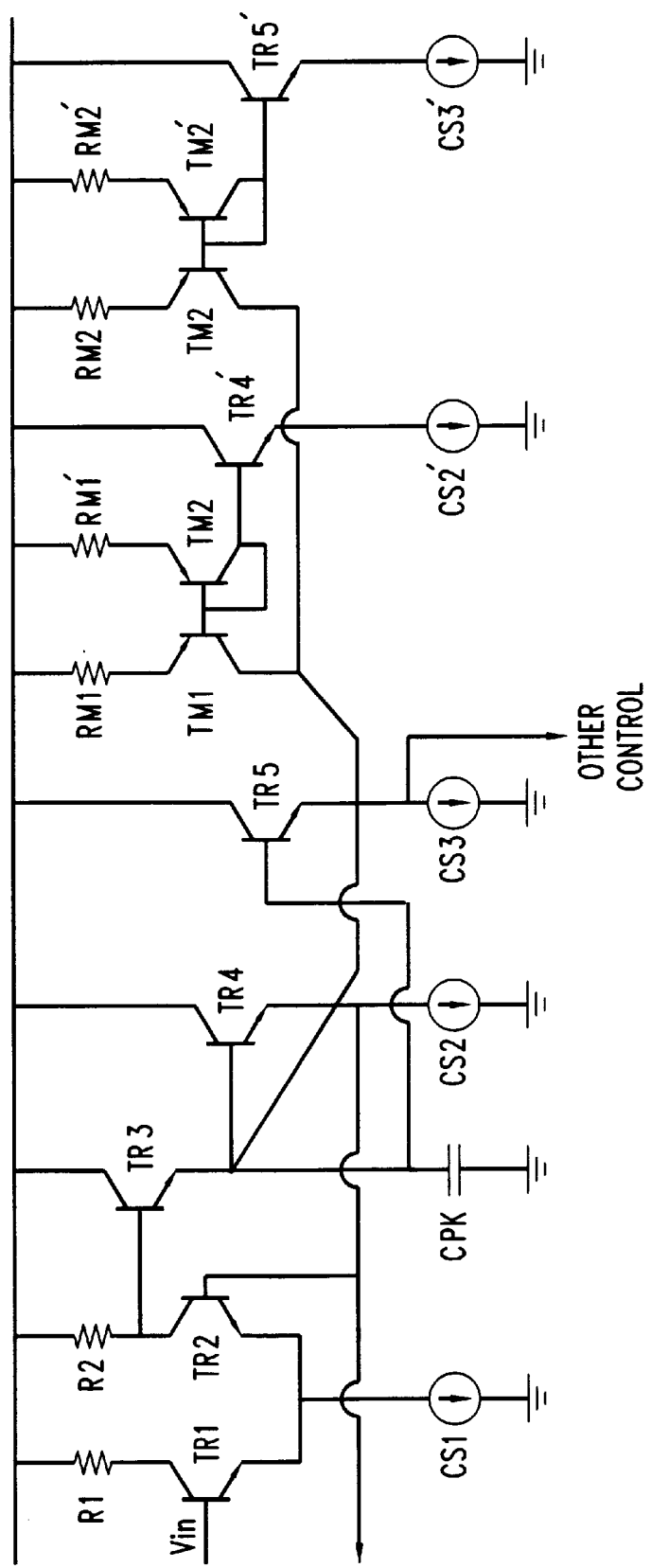
FIG. 2 shows another exemplary embodiment of the invention but using two current mirrors.

FIG. 2 shows another exemplary embodiment of the invention but using two current mirrors. In the embodiment of the invention shown in FIG. 2, all components that have the same reference labels as components of FIG. 1 operate in the same manner as such identically labeled components in FIG. 1 operate. What FIG. 2 adds over the embodiment of the invention shown in FIG. 1 is an additional buffer formed by transistor TR5 and current source CS3, which is useful in applications that require some other circuit to receive the value supplied as output from the peak detector, i.e., the same value that is exemplarily provided to the threshold detection circuit. Such an additional buffer causes the flow of an additional leakage current from peak detector capacitor Cpk. A duplicate of this additional leakage current is developed by recreating the leakage current to TR5 and then using a second current mirror which injects the duplicate additional leakage current back into peak detector capacitor Cpk to cancel the effect of the additional leakage current.

The additional leakage current is recreated by the coupling of transistor TR5' to current source CS3' in the same manner as transistor TR5 is coupled to current source CS3. Transistor TR5' is substantially identical to transistor TR5, i.e., to within manufacturing tolerances transistors TR5' and TR5 are identical. Also, current source CS3' is substantially identical to current source CS3, i.e., to within manufacturing tolerances CS3' and CS3 are identical. As a result, there is a leakage current into the base of TR5' that is substantially identical to the leakage current from peak detector capacitor Cpk into the base of TR5.

The second current mirror is formed by TM2, TM2', RM2, and RM2'. TM2 is substantially identical to TM2' and RM2 is substantially identical to RM2'. Note that transistors TM2 and TM2' are PNP-type transistors. As a result, the leakage current into the base of TR5' is mirrored at the collector of TM2, which is the output of the current mirror. This mirrored leakage current, which is a duplicate of the additional leakage current, is supplied to the node at which peak detector capacitor Cpk, TR3 and TR4 are coupled, so that the duplicate additional leakage current is injected into peak detector capacitor Cpk.

Figure 3:
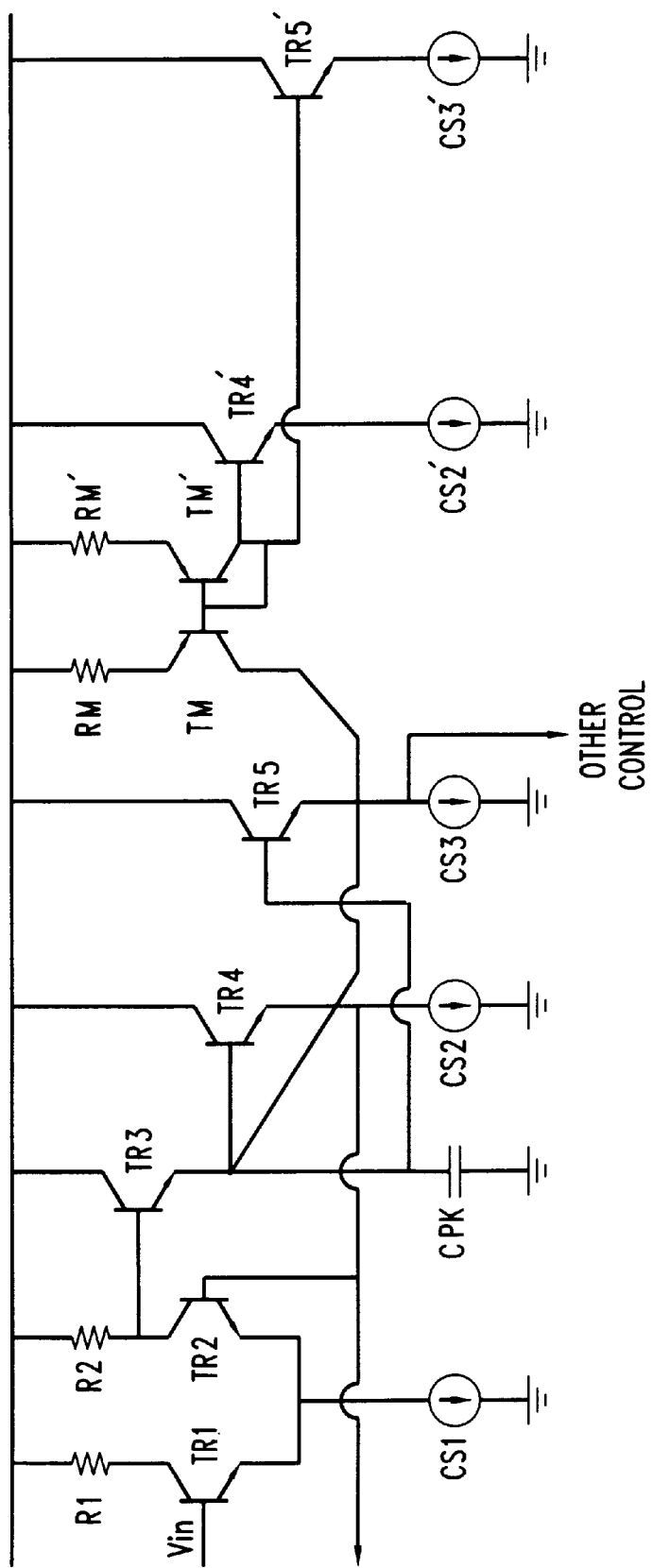
FIG. 3 shows yet another exemplary embodiment of the invention but using only a single current mirror.

FIG. 3 shows another exemplary embodiment of the invention using only a single current mirror. In the embodiment of the invention shown in FIG. 3, all components that have the same reference labels as components of FIG. 1 or FIG. 2 operate in the same manner as such identically labeled components in FIG. 1 or FIG. 2 operate. FIG. 3 simplifies over the embodiment of the invention shown in FIG. 2 by only requiring a single current mirror to inject both the duplicate leakage currents, i.e., the leakage currents caused by TR4 and TR5. In other words, a single current mirror is used to develop a single current which totals the value of the leakage currents caused by TR4 and TR5, and it is this single current that is injected into peak detector capacitor Cpk. As in FIGS. 1 and 2, in FIG. 3 the duplicate of the leakage current caused by TR4 is developed by coupling transistor TR4' to current source CS2' in the same manner as transistor TR4 is coupled to current source CS2. Also, as in FIG. 2, in FIG. 3 the duplicate of the leakage current caused by TR5 is developed by coupling transistor TR5' to current source CS3' in the same manner as transistor TR5 is coupled to current source CS3.

As in FIG. 1, TM, TM', RM, and RM' are arranged as a current mirror. TM is substantially identical to TM' and RM is substantially identical to RM'. However, the source of the current to be mirrored is the combined leakage currents into TR4' and TR5', since the bases of both TR4' and TR5' are coupled together to the current mirror. As a result, the current generated and supplied as output by the current mirror is the total of the leakage currents caused by TR4 and TR5. This mirrored total leakage current, which is a duplicate of the total leakage current caused by TR4 and TR5, is supplied to the node at which peak detector capacitor Cpk, TR3 and TR4 are coupled, so that the total of the current that is leaking is injected into peak detector capacitor Cpk.

Although it has been stated herein that the duplicate leakage current is injected into peak detector capacitor Cpk, an alternative way of looking at the duplicate leakage current is that it cancels the leakage current. Further alternatively, the duplicate leakage current may be view as supplying the actual current for the leakage current so that the value stored in peak detector capacitor Cpk remains unchanged.

What is claimed is:

1. A peak detector, comprising:

a capacitor for storing a voltage value;

a first buffer for buffering said value stored in said capacitor, said buffer causing a leakage current to be extracted from said capacitor; and a first current injector for injecting into said capacitor a current substantially equal to said leakage current, the value of said current substantially equal to said leakage current being automatically determined and continuously tracking the value of said leakage current.

2. A peak detector, comprising:

a capacitor for storing a voltage value;

a first buffer for buffering said value stored in said capacitor, said buffer causing a leakage current to be extracted from said capacitor;

a first current injector for injecting into said capacitor a current substantially equal to said leakage current;

a second buffer for buffering said value stored in said capacitor, said second buffer causing a second leakage current to be extracted from said capacitor; and a second current injector for injecting into said capacitor a current substantially equal to said leakage current.

3. A peak detector, comprising:

a capacitor for storing a voltage value;

a first buffer for buffering said value stored in said capacitor, said buffer causing a leakage current to be extracted from said capacitor;

a first current injector for injecting into said capacitor a current substantially equal to said leakage current;

a second buffer for buffering said value stored in said capacitor, said second buffer causing a second leakage current to be extracted from said capacitor; and wherein said first current injector also injects a current substantially equal to said second leakage current, whereby the total current injected by said first current injector is the sum of said first and second leakage currents.

4. A peak detector, comprising:

a capacitor for storing a voltage value;

a first buffer for buffering said value stored in said capacitor, said buffer causing a leakage current to be extracted from said capacitor; and a first current injector for injecting into said capacitor a current substantially equal to said leakage current;

wherein said current injector is a current mirror coupled to a duplicate of said buffer.

5. A peak detector, comprising:

a capacitor for storing a voltage value;

a first buffer for buffering said value stored in said capacitor, said buffer causing a leakage current to be extracted from said capacitor;

a first current injector for injecting into said capacitor a current substantially equal to said leakage current;

a second buffer for buffering said value stored in said capacitor, said second buffer causing a second leakage current to be extracted from said capacitor; and a second current injector for injecting into said capacitor a current substantially equal to said leakage current;

wherein said first and second current injectors are each a current mirror coupled to a duplicate of respective ones of said first and second buffers.

6. A peak detector, comprising:

a capacitor for storing a voltage value;

a first buffer for buffering said value stored in said capacitor, said buffer causing a leakage current to be extracted from said capacitor;

a first current injector for injecting into said capacitor a current substantially equal to said leakage current;

a second buffer for buffering said value stored in said capacitor, said second buffer causing a second leakage current to be extracted from said capacitor; and wherein said first injector is a current mirror coupled to a duplicates of each of said first and second buffers.

7. A method for use in a peak detector, said method comprising the steps of:

automatically generating a duplicate of a leakage current from a capacitor through the use of continuous tracking of the value of said leakage current, said capacitor being used in said peak detector for storing peak voltages; and injecting said duplicate leakage current into said capacitor.

8. The invention as defined in claim 7 wherein said leakage current is caused by a single buffer.

9. A method for use in a peak detector, said method comprising the steps of:

generating a duplicate of a leakage current from a capacitor used in said peak detector for storing peak voltages; and injecting said duplicate leakage current into said capacitor;

wherein said leakage current is caused by a two or more buffers.

10. The invention as defined in claim 7 wherein said injecting is performed by a single current mirror which is mirroring a source generating an equivalent to said leakage current.

11. A method for use in a peak detector, said method comprising the steps of:

generating a duplicate of a leakage current from a capacitor used in said peak detector for storing peak voltages; and injecting said duplicate leakage current into said capacitor;

wherein said injecting is performed by a plurality of current mirrors, each current mirror of said plurality of current mirrors mirroring a source generating an equivalent to at least one component of said leakage current.

12. A method for use in a peak detector, said method comprising the steps of:

automatically generating a duplicate of a leakage current from a capacitor through the use of continuous tracking of the value of said leakage current, said capacitor being used in said peak detector for storing peak voltages; and injecting said duplicate leakage current into a node coupled to said capacitor through which said leakage current is flowing from said capacitor.

13. A peak detector, comprising:

means for generating a duplicate of a leakage current from a capacitor used in said peak detector for storing peak voltages, the value of said duplicate leakage current automatically determined and continuously tracking the value of said leakage current; and means for injecting said duplicate leakage current back into said capacitor.

14. The invention as defined in claim 13 wherein said peak detector further comprises one or more buffers which cause said leakage current.

15. The invention as defined in claim 13 wherein said means for injecting comprises at least one current mirror coupled to at least one source generating an equivalent to at least one component of said leakage current.

16. A peak detector, comprising:
    a differential amplifier;
    a differential amplifier buffer coupling an output of said differential amplifier to a peak detector capacitor;
    a first buffer for buffering said value stored in said capacitor, said buffer causing a leakage current to be extracted from said capacitor; and
    a first current injector for injecting into said capacitor a current substantially equal to said leakage current, the value of said current substantially equal to said leakage current being automatically determined and continuously tracking the value of said leakage current.

17. A peak detector, comprising:
    a differential amplifier;
    a first transistor coupling an output of said differential amplifier to a peak detector capacitor;
    a second transistor arranged to buffer said value stored in said capacitor, said second transistor causing a first leakage current to be extracted from said capacitor; and
    at least one current mirror for injecting into said capacitor a current generated by mirroring a reference current generated by using at least a transistor substantially identical to said second transistor and arranged in an identical biasing configuration as said second transistor.

18. The invention as defined in claim 17 further comprising:
    a third transistor arranged to also buffer said value stored in said capacitor, said third transistor causing a second leakage current to be extracted from said capacitor; and
    at least a second current mirror for injecting into said capacitor a current generated by mirroring a reference current generated by using at least a transistor substantially identical to said third transistor and arranged in an identical biasing configuration as said third transistor.

19. The invention as defined in claim 17 further comprising:
    a third transistor arranged to also buffer said value stored in said capacitor, said third transistor causing a second leakage current to be extracted from said capacitor; and
    said at least one current mirror also injects into said capacitor a current generated by also mirroring a reference current generated by using at least a transistor substantially identical to said third transistor and arranged in an identical biasing configuration as said third transistor.

* * * * *